United States Patent [19]

Patukonis

[11] 4,330,765
[45] May 18, 1982

[54] SWITCHABLE MICROWAVE STEP ATTENUATOR WITH COMPENSATION FOR LINEAR OPERATION OVER WIDE FREQUENCY RANGE

[75] Inventor: Robert J. Patukonis, Ijamsville, Md.

[73] Assignee: Weinschel Engineering Co., Inc., Gaithersburg, Md.

[21] Appl. No.: 156,834

[22] Filed: Jun. 5, 1980

Related U.S. Application Data

[63] Continuation-in-part of Ser. No. 124,663, Feb. 26, 1980, abandoned.

[51] Int. Cl.³ .............................................. H01P 1/22
[52] U.S. Cl. .................................. 333/81 A; 333/246
[58] Field of Search .................... 333/81 R, 81 A, 105, 333/262; 323/220, 223, 233, 297, 354

[56] References Cited

U.S. PATENT DOCUMENTS

| | | | |
|---|---|---|---|
| 2,823,358 | 2/1958 | Means et al. | 333/105 |
| 3,014,187 | 12/1961 | Sher et al. | 333/81 R |
| 3,449,697 | 6/1969 | Mison . | |
| 3,626,352 | 12/1971 | McCoig | 333/81 R X |
| 4,138,637 | 2/1979 | Weinert | 333/81 R X |

FOREIGN PATENT DOCUMENTS

| | | | |
|---|---|---|---|
| 2329288 | 1/1974 | Fed. Rep. of Germany | 333/81 R |
| 834618 | 5/1960 | United Kingdom | 333/81 A |

*Primary Examiner*—Paul L. Gensler
*Attorney, Agent, or Firm*—Howard L. Rose

[57] ABSTRACT

A programmable microwave card-type step attenuator is compensated for switch capacitance to render its attenuation response effectively insensitive to frequency over most of its dB range and comprises a plurality of cascaded attenuator sections disposed on a microstrip card with each attenuator section including a deposited film microstrip resistive network adapted to be switched into or out of the signal line by a miniature relay switch, a minimum loss transmission line being inserted into the signal line when the resistive network is switched out. Each of the microstrip resistive networks includes a reactive element connected thereto to compensate the frequency response of the resistive networks due to deviations from the optimum electrical length, thereby minimizing the frequency sensitivity of the attenuation characteristic of the section. Inductive effects are achieved by use of suitably shaped conductive areas or by removal of portions of the resistive networks. Capacitive effects are achieved by use of capacitances integrally formed with the resistive network. In addition, a window opening arrangement is provided which enables the required electrical connections of the attenuator circuit to be achieved with minimal length conductors. Compensation at the low levels of attenuation, i.e., 1 dB, 2 dB and perhaps 4 dB, cannot be effectively compensated by the aforesaid method alone and the attenuator may further comprise resistance stubs added to the minimum loss line to provide an additional increase in loss with frequency that parallels the attenuation sensitivity with frequency of the uncompensated lower dB attenuator networks.

27 Claims, 11 Drawing Figures

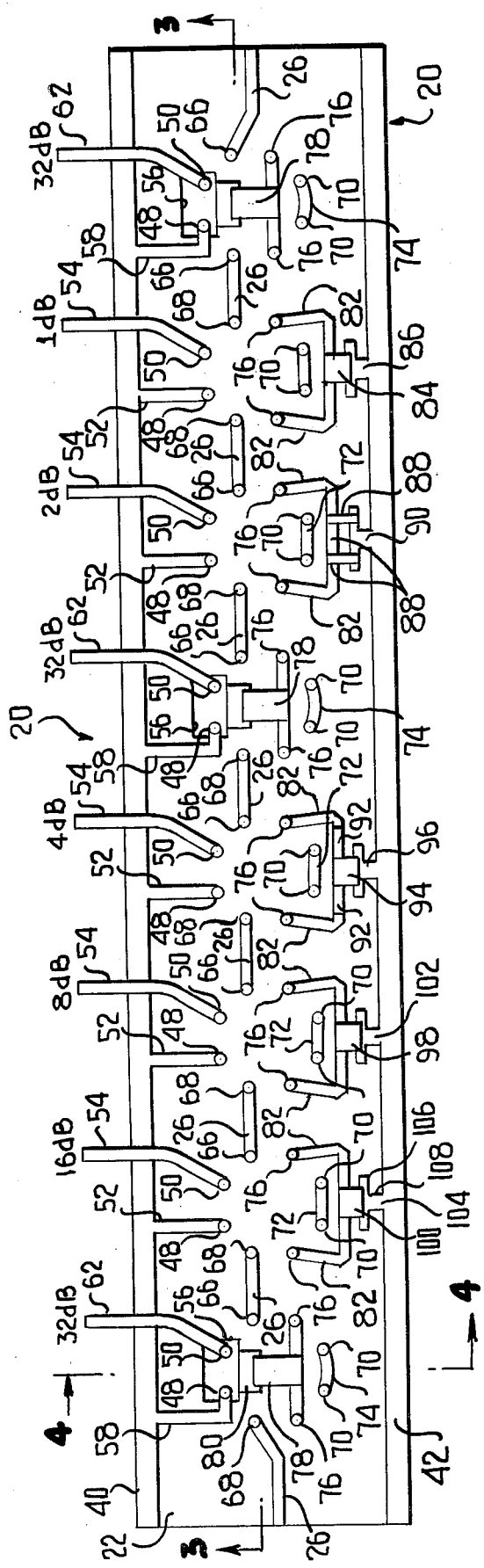

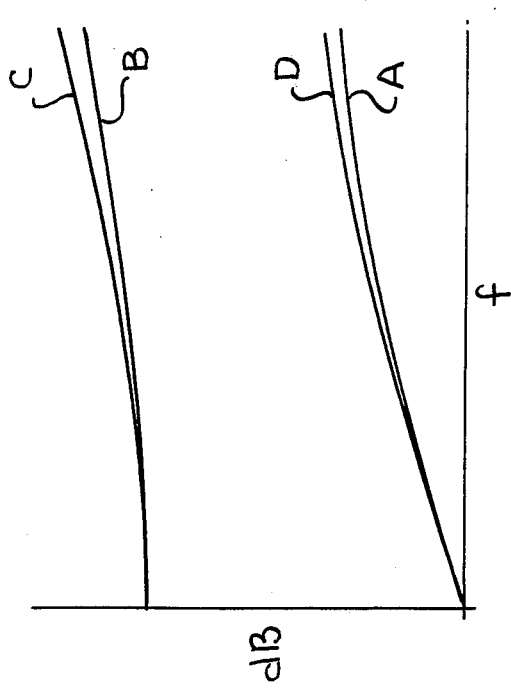
FIG.10
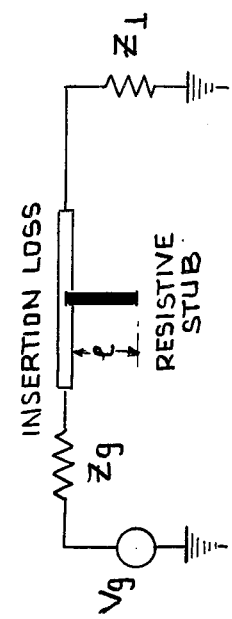
FIG.11
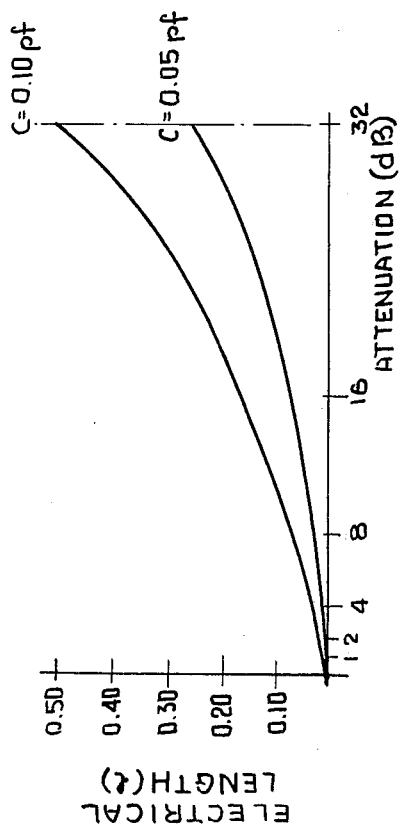
FIG.7
FIG.8
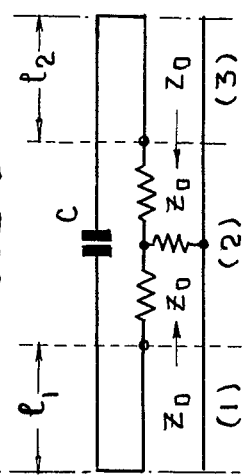
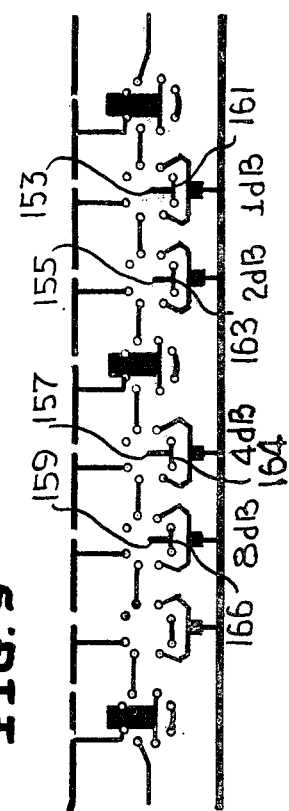
FIG.9

SWITCHABLE MICROWAVE STEP ATTENUATOR WITH COMPENSATION FOR LINEAR OPERATION OVER WIDE FREQUENCY RANGE

RELATED APPLICATIONS

This application is a continuation-in-part of my copending application Ser. No. 124,663 filed Feb. 26, 1980, now abandoned.

TECHNICAL FIELD

The present invention relates to a variable step attenuator which may be inserted into a transmission line or measuring circuit and varied over a wide range of step values and more particularly to a card-type step attenuator with a series of attenuator sections each of which may be switched into or out of a circuit independently of other attenuator sections.

BACKGROUND OF THE INVENTION

Switchable microwave step attenuators have been previously developed which are intended to provide attenuation at selectively adjustable levels. Typically, the prior art attenuator devices employ a series of attenuator sections designed to provide attenuation in discrete steps. The overall attenuation achieved by such devices is determined by selectively inserting different attenuator sections which, in effect, are connected in series with the microwave transmission line to provide the desired attenuation level.

Although attenuators capable of high attenuation levels have been proposed using the present switch and switching arrangement, in practice, it has been particularly difficult to achieve attenuation as high as 32 dB with minimum frequency sensitivity by the prior art devices. It is desired to provide a switchable microwave step attenuator capable of minimum sensitivity with signals of widely varying frequency, e.g., from DC to 2 gigahertz or more. However, a serious problem arises because of the inherent interelectrode capacitance of the switch in the attenuator which becomes increasingly more troublesome at higher frequencies. As a result, it has been quite difficult to achieve satisfactory linear operations in this type of switchable microwave step attenuators. In instances where linear operation has been achieved, it has been only over limited frequency ranges.

Prior Art references such as U.S. Pat. No. 4,107,633 to Scaletta disclose the use of card-attenuators in transmission and measuring type circuitry. However, when it is attempted to deposit a plurality of separate resistive sections on the same microstrip card and attach switches to each of the resistive sections to switch the resistive sections into and out of the circuit, it is found that substantial parasitic or leakage capacitance is developed across the switched terminals. The leakage capacitance across any given resistive section causes that resistive section to become frequency sensitive. Since in such a programmable attenuator card the attenuation is additive, that is, the values of the attenuator are developed by selecting the proper resistive sections and cascading them, the errors in the individual attenuator sections are also additive. Thus, as the program attenuation is increased, the frequency sensitivity of the attenuation of the card is also increased. In applications where the attenuation accuracy is important, this frequency sensitivity of the attenuation characteristic is completely unacceptable.

An additional reference of interest is U.S. Pat. No. 3,449,697 to Mison which provides an attenuator for use at very high frequencies. The apparatus has a plurality of sliding shields each of which is movable relative to a series resistance of a pi-section attenuator pad of each attenuator section to provide a capacitance which increases or decreases attenuation at high frequencies to compensate for the capacitance effects across switch contacts employed to switch each section in or out. The difficulty with such a device is that the shields can move and, therefore, require constant attention. More importantly, the patent does not provide the information necessary to permit the apparatus to be initially designed and all parameters determined at the time of manufacture and thereafter be free of additional adjustment.

Accordingly, it is an object of the present invention to provide a card-type programmable step attenuator with a monotonic attenuation characteristic even with small—say 0.25 dB—increments of attenuation.

A further object of the present invention is to compensate for the interelectrode capacitance across the switches controlling insertion and removal of attenuator sections in a programmable card-type attenuator.

Another object of the invention is to provide a card-type programmable microwave step attenuator which achieves attenuation in one dB increments from 0 dB to 127 dB and operates with minimum frequency sensitivity over a frequency range from 0 to 2 gigahertz or more.

It is also an object of the invention to provide a switchable microwave step attenuator which incorporates compensation for deleterious capacitive effects encountered at high frequencies without the need for additional circuit components.

A further object of the invention is to provide a card-type, programmable microwave step attenuator which is less complicated in structure than prior art devices and inexpensive to manufacture.

It is a further object of the invention to provide a switchable microwave step attenuator circuit advantageously mounted on a single substrate and wherein the actual circuit components are adapted to provide the required compensation for deviation of the electrical length of each attenuator section from the optimal electrical length.

It is another major object of the present invention to provide a card-type programmable microwave step attenuator having resistive stubs added to the minimum loss circuit when the lower value attenuator sections are withdrawn from operation to render the frequency sensitivity of the device neglectable over a wide frequency range.

SUMMARY OF THE INVENTION

The present invention is based on the recognition that each stage of a microwave attenuator including an attenuator and transmission line section, and a switch device for selectively connecting this section to the main transmission line is characterized by an optimal electrical length for a desired level of attenuation and switch interelectrode capacitance which minimizes frequency sensitivity. However, since it is not always possible to construct each section of the attenuator with the required physical dimensions to achieve the optimal electrical length, it is necessary to provide compensation for deviation from this optimal electrical length to maintain a substantially constant level of attenuation over a desired frequency range. The attenuator element may have some inherent capacitance effecting response; however, the major part of the capacitive effects is introduced by the switch device employed to connect the attenuator to the transmission line. The invention recognizes that, for each level of attenuation and switch capacitance there is an optimal electrical length which minimizes frequency sensitivity. Thus, by providing compensation for deviations of each section from its optimal electrical length, it is possible to maintain a substantially constant level of attenuation over a defined frequency range.

In accordance with the present invention, there is provided a programmable microwave step attenuator including a plurality of attenuator sections cascaded in series, with each of the attenuator sections compensated for switch capacitance effects, and a switch with input and output terminals and a control terminal. The switch is operable between two positions to connect a signal through one of at least two available paths from the switch input terminal to the switch output terminal in accordance with the signal on the control terminal. One path includes a deposited film resistive attenuator network connected across the input and output switch terminals and another path comprises a minimum loss network connected across the input and output switch terminals. A reactive component is formed as an element on the card and is connected to the resistive network to compensate the response of this network for deviation from the prescribed electrical length. Such compensation equalizes, at least above 4 dB, the attenuator response of the section resulting in an essentially flat attenuation characteristic up to frequencies of 2 GHz or more.

It will be noted from the device that usually inductance has been added but under some circumstances, capacitance may be added. It will also be noted that at the low levels of attenuation the compensation required becomes too large to be achieved in this manner and an important feature of the invention relates to compensation in this lower range of attenuation.

The optimum electrical length "1" can be determined by substituting values of "1" into the following equation:

$$\text{Insertion Loss (dB)} = 10 \log_{10} \frac{[e^{\alpha}(\cos Bl - \omega c \sin Bl)]^2 + [e^{\alpha}(\omega c \cos Bl + \sin Bl) - \omega c]^2}{\left[1 - \omega c \left(\frac{e^{\alpha} + e^{-\alpha}}{2}\right) \sin Bl\right]^2 + \left[\omega c \left(\frac{e^{\alpha} - e^{-\alpha}}{2}\right) \cos Bl\right]^2}$$

where $\alpha$ = attenuation per unit length of transmission line in dB in nepers (i.e. divided by 8.6858)
where $\beta$ = phase shift per unit length of transmission line
where $\omega = 2\pi \times$ frequency
where $1$ = total electrical length of the attenuator resistive network including the length of the leads thereto
where c = net leakage capacitance across the switch contacts normalized to the characteristic impedance $Z_o$ of the transmission line;
thereby determining the value providing the desired attenuation with least frequency sensitivity.

A preferred embodiment of the microwave attenuator circuit comprises an insulative substrate having a ground plane formed on one side and a transmission line provided on the other side of the substrate, a plurality of deposited film resistive attenuator sections formed on the substrate and a plurality of switch means each including switchable contact elements for selectively connecting in said transmission line a minimum loss path and a higher loss path of particular value. Each attenuator section includes in the high loss path a resistive network means coupled to the ground conductor and to transmission lines connected between the switchable contact elements. The resistor network transmission line combination of each section is designed to achieve the desired electrical length as determined by the above equation to maintain a substantially constant level of attenuation over a desired frequency range. However, in cases where the optimal length cannot be used, a compensation means is necessary to compensate for the deviation from the optimal electrical length. The compensation means may be embodied as a conductive pad formed on the substrate for coupling the resistive network means to the ground conductor and shaped to provide a compensating shunt inductance. For example, the conductive pad can be necked down to provide the compensating inductance. Alternatively, the attenuator means comprises a deposited film resistive pad formed on the substrate with a portion of the resistive pad removed to provide a compensating series inductance. Further, if required, a compensating capacitance may be formed integrally with the attenuator means to provide the necessary compensation for deviation from the optimal electrical length. For example, where the attenuator means comprises a resistive pad formed on the substrate, the compensating capacitor is formed by an overlying insulating glaze and a conductor formed on top of the glaze and coupled to the ground conductor.

The invention is specifically embodied in a switchable microwave step attenuator circuit in which a plurality of relays is mounted on a substrate having a ground plane and a transmission line on its opposite surfaces. Each relay is provided with switchable contact elements selectively connectable to the transmission line to establish in the alternative, a minimum loss and a higher loss path thereacross. The circuit includes a plurality of resistive elements, each coupled between the ground plane and the switchable contact elements corresponding to the high impedance path of the individual relays. Each attenuator element is characterized by an optimal electrical length for a desired level of attenuation and associated switch capacitance which minimizes frequency sensitivity. Compensating means are associated with all of the attenuation sections with each attenuator element providing compensation for deviation from the optimal electrical length to maintain a substantially constant level of attenuation over a desired frequency range. Preferably, the impedance elements are designed to provide attenuation steps corresponding to 1 dB, 2 dB, 4 dB, 8 dB, 16 dB and 32 dB. Three 32 dB impedance elements may be coupled together to provide a combined 96 dB attenuation level. The relays are selectively operable to combine various attenuator sections to achieve attenuation in 1 dB increments from 0 dB to 127 dB.

In accordance with a preferred feature of the invention, one or more window openings is formed in the substrate to provide a path for electrical connections to the ground plane. Preferably, the corresponding attenuator element is formed on the surface of the substrate and connected to the ground plane conductor by a conducting area formed on the substrate surface which extends through the window opening into electrical contact with the ground plane conductor. This type of electrical connection through the window opening is necessary when minimized electrical length is required in the attenuator.

In accordance with another important feature of the present invention, in order to compensate for the switch and other parasitic capacitances at low levels of attenuation, a resistive stub is added to the minimum loss circuit of each section, which is inserted in the transmission line upon withdrawal of the higher loss network. It is to be remembered that devices of the type with which the present invention are concerned are used for, among other uses, calibration. The instrument is inserted in a signal line with all attenuator networks by-passed so that comparisons may be made at different attenuation levels against a "zero" attenuation base. In this embodiment of the invention, the resistive stubs added to the minimum loss paths of the low attenuation sections increase the attenuation response of this minimum loss with frequency along the same curvature as their associated resistive networks whereby the base and higher loss curves rise along generally parallel curves with frequency.

DESCRIPTION OF THE DRAWINGS

The accompanying drawings illustrate a preferred embodiment of the present invention and, together with the description, serve to explain the principles and operation of the invention.

FIG. 2 is a detailed plan view illustrating the components of the microwave attenuator circuit formed on an insulative substrate;

FIG. 3 is an elevation view, partially in section, of the microwave attenuator circuit and substrate taken along line 3—3 of FIG. 2;

FIG. 7 is a plot of electrical length versus attenuation which illustrates the desired characteristics of the microwave attenuator circuit of the present invention;

FIG. 8 is a schematic diagram used to analyze the microwave attenuator circuit;

FIG. 9 is a schematic diagram of a preferred embodiment of the present invention illustrating the addition of resistive stubs to the minimum loss lines of the circuit of FIG. 2;

FIG. 10 illustrates plots of the attenuation versus frequency characteristic of a new order attenuator pad and its compensated minimum loss circuit; and FIG. 11 is the equivalent circuit of the resistive stub configuration.

DESCRIPTION OF THE PREFERRED EMBODIMENTS

Figure 1:
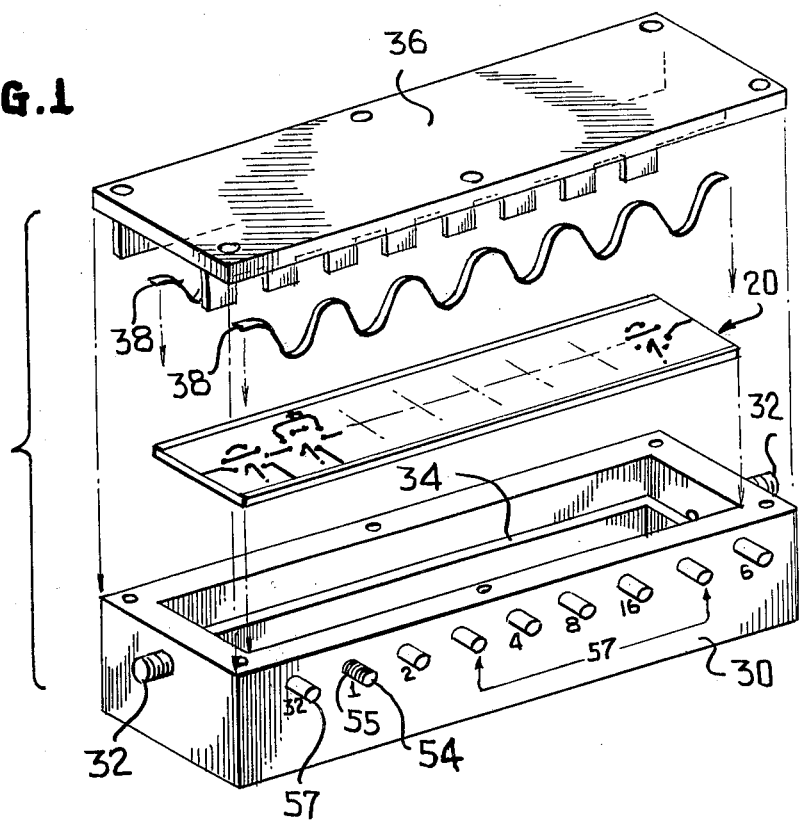
FIG. 1 is an overall perspective view of a switchable microwave step attenuator embodying the present invention.
Figure 4:
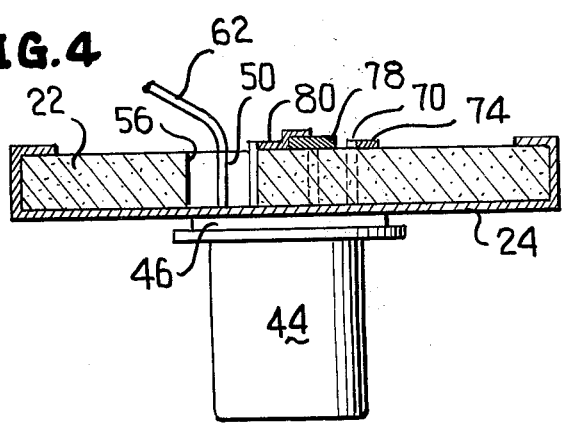
FIG. 4 is a section of the substrate taken along line 4—4 of FIG. 2.

Referring to FIGS. 1-3, a microwave attenuator embodying the invention includes a switchable microwave step attenuator circuit, generally 20 (FIG. 2) formed on an insulative substrate 22, e.g., alumina. A ground plane conductor 24 (FIG. 3) of conductive material is formed on the lower surface of substrate 22. A transmission line is formed by conductive strips 40 and 42 along the upper edges, as viewed in FIGS. 1 and 2 of card 22, and as a series of conductive strips 26 extending longitudinally along the center of the upper surface of the substrate. A plurality of attenuator stages designated 1 dB, 2 dB, 4 dB, 8 dB, 16 dB and 32 dB are connected in series by the segments 26 of the center conductor of the transmission line. Each attenuator section is switchable between two attenuation levels, i.e., a minimum loss level which provides no attenuation and a higher loss level which connects a suitable deposited film resistive element in the transmission line to provide the designated attenuation level. The attenuator sections are selectively operable to provide overall attenuation, in 1 dB increments, over a range from 0 dB to 127 dB.

Preferably, microwave attenuator circuit card 22 is contained within a generally rectangular housing 30 provided with a pair of coaxial threaded terminals 32 adapted to electrically connect a set of coaxial cables (not shown) to the ground plane 24 and conductor 26. An inwardly projecting ledge 34 is provided within housing 30 on which the substrate 22 is supported with electrical contact established between the ground plane 24 and the ledge 34. A metallic cover 36 is provided to electrically isolate the attenuator from stray electric fields. A pair of elongated metallic spring elements 38 is clamped by cover 36 along opposite edges of substrate 22 to provide electrical contact with conductors 40 and 42 and to firmly hold the microwave attenuator circuit within the housing.

Referring to FIG. 2, the elongated ground contact areas 40 and 42 formed on the upper surface of substrate 22 overlap the longitudinal edges of the substrate and extend into electrical contact with ground plane conductor 24 (FIG. 3) on its lower surface.

As illustrated in FIG. 3, a relay device 44 is mounted on the lower surface of substrate 22 at each attenuator section. The relay devices are connected to the ground plane conductor 24 by solder or conductive epoxy 46. Each relay device 44 functions as a double pole, double throw switch which serves to selectively connect a minimum loss path or a higher loss path to transmission line 26. Preferably, each relay device 44 comprises a TO-5 relay, Model No. 732-12, manufactured by Teledyne Corporation.

As illustrated in FIG. 2, each relay device 44 includes a set of 8 terminals arranged in a generally circular configuration which extend through suitable openings provided in substrate 22 for electrical engagement with other components of the microwave attenuator circuit on the upper surface of the substrate. For example, relay device 44 associated with the 1 dB attenuator section includes a pair of control terminals 48 and 50 which are employed to control its switching function. Control terminal 48 is electrically connected by a conductive strip 52 to ground contact strip 40. A control wire 54 connected to control terminal 50 extends upwardly from substrate 22 and is connected to an R.F. feedthrough filter 55 situated in one of a plurality of side openings 57 in housing 30 for connection to a control circuit (not shown) which provides input signals to selectively activate the attenuator sections. The control terminals of the 2 dB, 4 dB, 8 dB and 16 dB attenuator sections are similarly connected to ground contact strip 40 by conductive strips 52 and by leads 54 to the control circuit. Relay devices 44 associated with the 32 dB attenuator sections each include similar control terminals 48 and 50.

A window opening 56 is provided in substrate 22 at each 32 dB attenuator section which exposes control terminals 48 and 50 of the corresponding relay device. Each control terminal 48 of the 32 dB attenuator sections is connected to ground contact strip 40 by a conductive strip 58 formed on substrate 22 which extends through window opening 56 into electrical engagement with control terminal 48. A lead 62 is connected to control terminal 50 of the 32 dB attenuator section which extends upwardly through window opening 56 and outwardly through a suitable R.F. feedthrough 55 in side opening 57 provided in the housing for connection to the control circuit (not shown). Similarly, leads 54 and 62 are connected to control terminals 50 at the other of the attenuator sections and extend upwardly through corresponding window openings 56 and outwardly through corresponding side openings provided in housing 30. Control leads 62 of the 32 dB attenuators may be activated simultaneously or individually by the control circuit to provide a 32 dB, 64 dB or 96 dB of attenuation.

Referring to FIG. 2, each attenuator section includes input and output terminals 66 and 68, respectively, which are serially connected to the spaced segments of center conductor 26. Each attenuator section also includes a pair of contact elements 70 which are employed to establish a minimum loss path through the attenuator section. A straight conductive strip 72 is formed on substrate 22 and extends between terminals 70 in the 1 dB, 2 dB, 4 dB, 8 dB and 16 dB attenuator sections to provide the minimum loss paths therein. For each 32 dB attenuator section, a curved conductive strip 74 is formed on substrate 22 to electrically interconnect terminals 70. The curved conductive strip reduces capacitive coupling in the 32 dB attenuator section where due to the high attenuation of the section, the capacitive coupling may tend to cause some of the signal to by-pass the attenuator.

In addition, each attenuator section includes a pair of terminals 76 which are employed to establish a higher attenuation path through the attenuator section. For each 32 dB attenuator section, terminals 76 are connected by suitable conductive strips to a resistive pad 78 formed on the upper substrate surface and electrically connected to the group plane conductor by a contact pad 80 also formed on the substrate surface which extends downward through window opening 56 into electrical contact with the ground plane conductor. Resistive pad 78 is designed to provide a 32 dB attenuation level with relay 44 operated to connect terminals 76 to input and output terminals 66 and 68, respectively.

The 1 dB, 2 dB, 4 dB, 8 dB and 16 dB attenuator sections are similarly provided with attenuator elements coupled to terminals 76 to provide the desired levels of attenuation. For example, in the 1 dB attenuator section, terminals 76 are connected by a pair of curved conductive strips 82 to an attenuator element consisting of a $\pi$ network of resistances 84 formed on substrate 22. This $\pi$ network of resistances is connected by a T-shaped conductive pad 86 to ground conductor strip 42 and is adapted to provide a 1 dB attenuation level when connected to transmission line 26. Similarly, the 2 dB attenuator section includes an attenuator element consisting of a $\pi$ network of resistances 88 formed on substrate 22 and connected by a T-shaped conductive pad 90 to ground conductor strip 42. This $\pi$ network of resistances is designed to provide a 2 dB attenuation level when connected to transmission line 26. In the 4 dB attenuator section, the attenuator element comprises a T network including separate resistance elements 92, which are formed on substrate 22 and connected to curved conductive strips 82, and a resistive pad 94, which is also formed on the substrate and connected by a T-shaped conductive pad 96 to ground conductor strip 42. In the 8 dB and 16 dB attenuator sections, the attenuator elements comprise resistive pads 98 and 100, respectively, formed on substrate 22 which are connected to curved conductive strips 82 and to ground conductor strip 42 by T-shaped conductive pads 102 and 104, respectively.

The $\pi$ sections are used in the 1 and 2 dB sections because the use of the lumped T pad approach of the 4 dB or distributed approach of the other sections would provide a pad too narrow to be readily produced. The T-shaped conductive pads 86, 90, 96, 102 and 104 are shaped to provide appropriate effects. For example in the 16 dB attenuator, conductive pad 104 comprises a wide contact portion 106 connected to resistive pad 100 and a narrow neck portion 108 connected to ground conductive strip 42. The necked down configuration of conductive pad 104 provides inductance to compensate the response of the 16 dB attenuator section. T-shaped conductive pads 86, 90, 96 and 102 have similar configurations for the same purpose. However, each T-shaped conductive pad differs in actual dimensions to provide the desired amount of inductance for each attenuator section. True T's are not necessary; the pads 102 etc. may be necked down gradually or other necked down configurations may be employed. The objective of providing this inductance is to compensate for the deviation in each attenuator section from the optimal electrical length to maintain a substantially constant level of attenuation over the operating frequency range as explained below.

In the case of each 32 dB attenuator section, contact pad 80 may be similarly formed as a bar extending down the edge of the window to the ground plane to provide desired inductive effects. In addition, a portion of resistive pad 78 may be removed to achieve series inductive compensation. The removal of resistive material may also be employed to achieve compensating inductance with the resistive pads in the 4 dB, 8 dB and 16 dB attenuator sections. Window opening 56 in the 32 dB attenuator sections advantageously permits the necessary electrical connections to be made to the relay terminals with the shortest possible conductive elements and reduces the effects of the switch capacitance.

Figure 5:
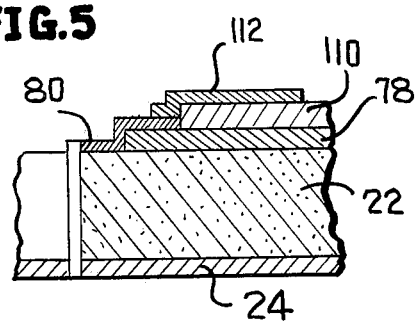
FIG. 5 is an enlarged section of the substrate illustrating a compensating capacitor thereon.

To provide capacitive compensation in the attenuator circuit, additional capacitances may be provided in each attenuator section. For example, referring to FIG. 5, to provide a compensating capacitance for instance in a 32 dB attenuator section, resistive pad 78 may be covered by an insulating glaze 110 and a conductive pad 112 may be formed on the top of the glaze which is coupled to ground plane conductor 24 via contact pad 80. Similar glazed capacitance devices may be provided, if necessary, at the other attenuator sections. The objective of providing this capacitance is also to compensate for deviation from the optimal electrical length as explained below.

Attenuator circuit 20 provides a desired level of attenuation determined by selective actuation of its attenuator sections. When none of relay devices 44 is operated, the attenuator circuit provides a 0 dB level of attenuation to establish a zero attenuation versus frequency characteristic of the circuit. On the other hand, with all relay devices 44 actuated, a 127 dB level of attenuation is provided. By selective activation of relay devices 44 in various combinations, the attenuator circuit provides attenuation in 1 dB increments from 0 dB to 127 dB. Preferably, the 32 dB attenuator sections are spaced apart to prevent undesired signal coupling across the attenuator circuit due to the proximity of the attenuator sections and high level of attenuation and the numerous available secondary paths.

Figure 6:
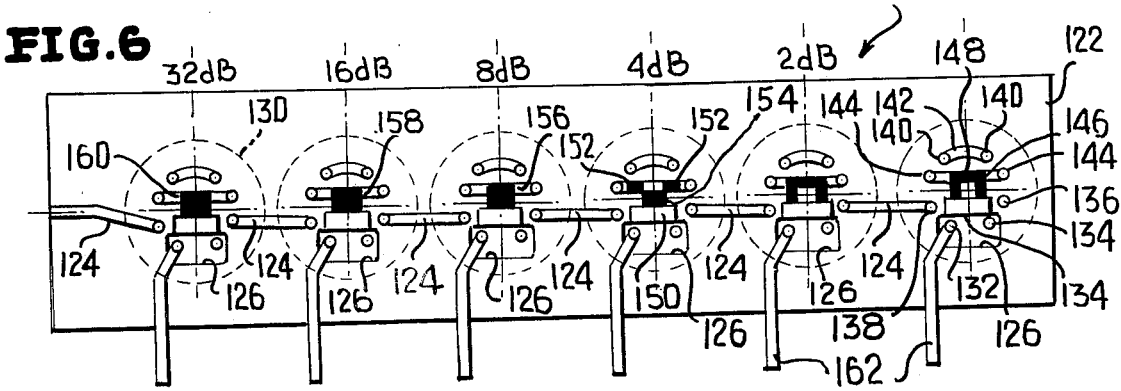
FIG. 6 is a plan view of another embodiment of the microwave attenuator circuit components and substrate.

Referring to FIG. 6, another embodiment of the microwave attenuator circuit, generally 120, includes a plurality of attenuator sections designated 1 dB, 2 dB, 4, dB, 8 dB, 16 dB and 32 dB, each provided with a window opening type of configuration. This type of configuration is preferred since fabrication is simpler and the interelectrode capacitance effects are reduced considerably relative to the prior design. The attenuator circuit includes an insulative substrate 122 having a ground plane conductor (not shown) formed on its lower surface and a transmission line 124 formed as a series of conductive strips extending longitudinally along the center of the upper surface of the substrate. Each attenuator section is provided with a rectangular window opening 126 formed in the substrate.

Each attenuator section includes a relay device 130 mounted on the lower surface of substrate 122 which is suitably connected to the groud plane conductor. Each relay device 130 functions as a double pole, double throw switch which serves to selectively connect a minimum loss path or a higher loss path to transmission line 124. Preferably, the relay devices 130 comprise a TO-5 relay, Model No. 732-12, manufactured by Teledyne Corporation.

Each relay device 130 includes a set of eight terminals arranged in a generally circular configuration which extend through suitable openings provided in substrate 122 for electrical engagement with other components of the microwave attenuator circuit on the upper surface of the substrate. A relay device includes a pair of control terminals 132 and 134 which are employed to control the switching function and a pair of input and output terminals 136 and 138, respectively, which are serially connected to the spaced segments of transmission line 124. The device 130 also includes a pair of contact elements 140 interconnected by a conductive strip 142 to establish a minimum loss path through the attenuator section. Preferably, conductive strip 142 is curved to prevent coupling effects in the attenuator section. In addition, each relay device 130 includes a pair of terminals 144 which are employed to establish a higher loss path through the attenuator section.

The 1 dB attenuator section includes an attenuator element connected to terminal 144 which comprises a $\pi$-pad or $\pi$ network including a set of resistances 146 and 148 formed on substrate 122. Resistance 146 is connected across terminals 144, while resistances 148 are connected in parallel between opposite ends of resistance 146 and a conductive pad 150 which extends through window opening 126 into electrical engagement with the ground plane conductor. Resistances 146 and 148 are designed to provide a 1 dB attenuation level when connected to transmission line 124. Similarly, the attenuator element of the 2 dB attenuator section comprises a $\pi$-pad or $\pi$ network formed on the upper substrate surface and designed to provide a 2 dB attenuation level. In the 4 dB attenuator section, the attenuator element comprises a T-pad or T network including resistive elements 152 formed on the substrate surface and connected to terminals 144 and a resistive pad 154 which connects resistive elements 152 to conductive pad 150. Resistance elements 152 and resistive pad 154 are designed to provide a 4 dB attenuation when connected to transmission line 124. Conductive pads 150 may be formed on substrate 122 with a T-shaped configuration to provide inductive effects in the attenuator sections.

The 8 dB, 16 dB and 32 dB attenuator sections employ attenuator elements comprising resistive pads 156, 158 and 160, respectively, formed on the surface of substrate 122 and connected between terminals 144 and conductive pads 150. Each conductive pad 150 can be T-shaped in configuration to provide inductive compensation in each attenuator section. Alternatively, a portion of the resistive pad may be removed to provide the desired series inductive effects. Capacitive compensation may be achieved in the same manner shown in FIG. 5 if necessary.

A lead 162 is provided at each attenuator section extending through window opening 126 to connect control terminal 132 to a control circuit (not shown) to provide control signals to selectively activate the attenuator sections. Control terminal 134 is directly connected to the ground plane conductor. The window opening advantageously permits the required electrical connections to be made with the shortest possible leads.

The attenuator sections are selectively activated in different combinations to achieve the desired attenuation levels. Additional 32 dB attenuator sections (not shown) may be included which are spaced apart along the transmission line to avoid undesirable signal coupling.

Theoretically, the above-described attenuators of FIGS. 2 and 6 should provide a monotonic attenuation response irrespective of frequency. However, it is found in practice that at microwave frequencies a substantial leakage capacitance is developed across the switches 40 for each of the attenuator sections. This net leakage capacitance is a result of interelectrode capacitances developed across various terminals in the switch. The effect of the net leakage capacitance is to make the attenuation response of each of the attenuator sections sensitive to frequency. This frequency sensitivity of the attenuation card is unacceptable.

It has been discovered that by adjusting the electrical length of each attenuator section between their respective terminals 76 to an optimum length, the effect of the leakage capacitance within the switch for the attenuator section is well compensated and the attenuation sensitivity is minimized with respect to frequency. The electrical length $l$ is equal to mechanical length of the thick film resistive deposit and the length of the leads connected between the switch terminals 76 to the resistive deposit times a constant. When the resistive material is deposited on alumina, the constant is 2.6.

Referring to FIGS. 7 and 8, the amount of compensation required in the attenuator circuit of this invention is determined by the following analysis. For the attenuator shown in FIG. 8, which includes transmission line sections (1) and (3) and resistive network (2) with an associated capacitance c, section (2) of the attenuator can be described by the following ABCD matrix:

$$\begin{pmatrix} A & B \\ C & D \end{pmatrix} = \begin{pmatrix} \cosh \alpha & \sinh \alpha \\ \sinh \alpha & \cosh \alpha \end{pmatrix} \quad (1)$$

where $\alpha$ is the attenuation in nepers, i.e., attenuation in dB/8.685889638. Since the input and output impedances are matched to the transmission line sections (1) and (3), the "Z" term which normally appears in B and C is set equal to one. It is noted that no terms containing length appear in the above matrix, and the only varying term is the attenuation $\alpha$.

Length l represents the electrical length of one of the transmission line sections. In the case of a substrate made of alumina, which has a dielectric constant of 9.8, the electrical length equals 2.6 times the mechanical length, i.e., one-half the length between the attenuator contacts.

The length of the attenuator and the transmission lines are lumped together in the two sections of transmission lines (1) (3) shown in FIG. 8. For analysis purposes, let $l_1$ and $l_3$ the lengths of sections (1) and (3), respectively, be equal to each other and equal to l.

The following cascaded ABCD matrices describe sections (1), (2) and (3) in their connected form. Again, since the impedance of the attenuator and the transmission lines are equal and normalized to one, no "Z" terms will appear in the matrices.

$$\begin{pmatrix} \cos \beta l & j\sin \beta l \\ j\sin \beta l & \cos \beta l \end{pmatrix} \begin{pmatrix} A & B \\ C & A \end{pmatrix} \begin{pmatrix} \cos \beta l & j\sin \beta l \\ j\sin \beta l & \cos \beta l \end{pmatrix} \quad (2)$$

Section (2) is represented by the middle matrix $$\begin{pmatrix} A & B \\ C & A \end{pmatrix}$$

The D element of the matrix has been replaced by A. This is allowed by knowing certain conditions of the network being represented and the ABCD matrix being used:

(1) the condition for electrical symmetry is A=D and,
(2) the condition for a passive network is AD−BC=1.

Multiplying out the terms of the matrices and collecting like terms yields $$\begin{pmatrix} A(\cos^2\beta l - \sin^2\beta l) + j\left(\frac{B+C}{2}\right)(2\sin\beta l \cos\beta l), & B\cos^2\beta l - C\sin^2\beta l + jA(2\sin\beta l \cos\beta l) \\ C\cos^2\beta l - B\sin^2\beta l + jA(2\sin\beta l \cos\beta l), & A(\cos^2\beta l - \sin^2\beta l) + j\left(\frac{B+C}{2}\right)(2\sin\beta l \cos\beta l) \end{pmatrix} \quad (3)$$

The following identities are used to reduce the above matrix:

$$\cos^2\beta l - \sin^2\beta l \equiv \cos 2\beta l \quad (a)$$
$$2\sin\beta l \cos\beta l \equiv \sin 2\beta l \quad (b)$$
$$\cos^2\beta l \equiv \frac{1 + \cos 2\beta l}{2} \quad (c)$$
$$\sin^2\beta l \equiv \frac{1 - \cos 2\beta l}{2} \quad (d)$$

Using these identities, the matrix now is reduced to:

$$\begin{pmatrix} A\cos 2\beta l + j\left(\frac{B+C}{2}\right)\sin 2\beta l, & \left(\frac{B-C}{2}\right) + \left(\frac{B+C}{2}\right)\cos 2\beta l + jA\sin 2\beta l \\ \left(\frac{C-B}{2}\right) + \left(\frac{B+C}{2}\right)\cos 2\beta l + jA\sin 2\beta l, & A\cos 2\beta l + j\left(\frac{B+C}{2}\right)\sin 2\beta l \end{pmatrix} \quad (4)$$

Recognizing that if $2\beta l$ is set to equal $\beta L$, where L=2l, then L represents the total length of the attenuator and transmission line. Therefore, the matrix becomes:

$$\begin{pmatrix} A\cos\beta L + j\left(\frac{B+C}{2}\right)\sin\beta L & \left(\frac{B-C}{2}\right) + \left(\frac{B+C}{2}\right)\cos \beta L + jA\sin \beta L \\ \left(\frac{C-B}{2}\right) + \left(\frac{B+C}{2}\right)\cos \beta L + jA\sin \beta L & A\cos \beta L + j\left(\frac{B+C}{2}\right)\sin \beta L \end{pmatrix} \quad (5)$$

Substituting in the values for A, B and C for the attenuator of section (2):

$$\begin{pmatrix} \cosh\alpha \cos\beta L + j\sinh\alpha \sin\beta L & \sinh\alpha \cos\beta L + j\cosh\alpha \sin\beta L \\ \sinh\alpha \cos\beta L + j\cosh\alpha \sin\beta L & \cosh\alpha \cos\beta L + j\sinh\alpha \sin\beta L \end{pmatrix} \quad (6)$$

In order to combine the transmission line and attenuator with the shunting capacitor, y matrices must be used for each of the elements and the individual components must be added to obtain the combined y matrix. However, for ease of manipulating these matrices, the above matrix (6) is represented by the following simplified matrix:

$$\begin{pmatrix} A_T & B_T \\ C_T & A_T \end{pmatrix} \quad \text{where} \quad \begin{aligned} A_T &= \cosh\alpha \cos\beta L + j\sinh\alpha \sin\beta L \\ B_T &= \sinh\alpha \cos\beta L + j\cosh\alpha \sin\beta L \\ C_T &= \sinh\alpha \cos\beta L + j\cosh\alpha \sin\beta L \end{aligned}$$

Then the y matrix for the attenuator and transmission line is $$\begin{pmatrix} \frac{A_T}{B_T} & -\frac{1}{B_T} \\ -\frac{1}{B_T} & \frac{A_T}{B_T} \end{pmatrix}$$

The y matrix for the capacitor is $$\begin{pmatrix} j\omega c & -j\omega c \\ -j\omega c & j\omega c \end{pmatrix}$$

The combined y matrix of the attenuator and transmission line shunted by the capacitor is $$\begin{pmatrix} \frac{A_T + j\omega cB_T}{B_T} & -\left(\frac{1 + j\omega cB_T}{B_T}\right) \\ -\left(\frac{1 + j\omega cB_T}{B_T}\right) & \frac{A_T + j\omega cB_T}{B_T} \end{pmatrix} = \begin{pmatrix} y_{11} & y_{12} \\ y_{21} & y_{22} \end{pmatrix} \quad (7)$$

Converting this y matrix back in to the ABCD matrix is accomplished in the following manner:

$$\begin{pmatrix} A' & B' \\ C' & D' \end{pmatrix} = \begin{pmatrix} -\frac{y_{22}}{y_{21}} & -\frac{1}{y_{21}} \\ -\frac{\Delta y}{y_{21}} & -\frac{y_{11}}{y_{21}} \end{pmatrix}$$

where $\Delta y = y_{11}y_{22} - y_{12}y_{21}$

Evaluating $\Delta y$:

$$\Delta y = \left(\frac{A_T + j\omega cB_T}{B_T}\right)^2 - \left(\frac{1 + j\omega cB_T}{B_T}\right)^2$$

$$= \frac{(A_T)^2 + 2j\omega cA_TB_T - (\omega c)^2(B_T)^2}{(B_T)^2} -$$

$$\frac{1 + 2j\omega cB_T - (\omega c)^2(B_T)^2}{(B_T)^2}$$

$$\Delta y = \frac{A_T^2 - 1 + 2j\omega cB_T(A_T - 1)}{(B_T)^2}$$

Since the conditions of electrical symmetry and passive network still exist then $AD - BC = 1$. Letting $A = D$ then $A^2 - BC = 1$ and $A^2 = 1 + BC$, so that $$\Delta y = \frac{1 + B_TC_T - 1 + 2j\omega cB_T(A_T - 1)}{(B_T)^2}.$$

Simplifying:

$$\Delta y = \frac{B_TC_T + 2j\omega cB_T(A_T - 1)}{(B_T)^2} = \frac{B_T[C_T + 2j\omega c(A_T - 1)]}{(B_T)^2}$$

$$= \frac{C_T + 2j\omega c(A_T - 1)}{B_T}$$

The final ABCD matrix for attenuator and transmission line shunt by the capacitor is $$\begin{pmatrix} \frac{A_T + j\omega cB_T}{1 + j\omega cB_T} & \frac{B_T}{1 + j\omega cB_T} \\ \frac{C_T + 2j\omega c(A_T - 1)}{1 + j\omega cB_T} & \frac{A_T + j\omega cB_T}{1 + j\omega cB_T} \end{pmatrix} \quad (8)$$

The insertion loss for any ABCD matrix is $$\text{Loss (dB)} = 10 \log_{10} \left| \frac{AZ_L + DZ_S + B + CZ_LZ_S}{Z_L + Z_S} \right|^2 \quad (9)$$

However, when the network is terminated in impedances which match the characteristic impedance of the transmission line, then these impedances can also be normalized to 1.

The insertion loss thus equals:

$$10 \log_{10} \left| \frac{A + B + C + D}{2} \right|^2$$

where $A + B + C + D =$ $$\frac{A_T + j\omega B_T + B_T + C_T + 2j\omega c(A_T - 1) + A_T + j\omega cB_T}{1 + j\omega cB_T}$$

$$= \frac{2A_T + B_T + C_T + 2j\omega c(A_T + B_T - 1)}{1 + j\omega cB_T}$$

Noting that $B_T = C_T$ then:

$$A + B + C + D = \frac{2A_T + 2B_T + 2j\omega c(A_T + B_T - 1)}{1 + j\omega cB_T}.$$

Thus $$\frac{A + B + C + D}{2} = \frac{A_T + B_T + j\omega c(A_T + B_T - 1)}{1 + j\omega cB_T}.$$

Therefore, the insertion loss of the attenuator and transmission line shunted by the capacitor becomes:

$$\text{Loss (dB)} = 10 \log_{10} \left| \frac{A_T + B_T + j\omega c(A_T + B_T - 1)}{1 + j\omega cB_T} \right|^2$$

where
$A_T = \cos h\alpha \cos \beta L + j \sin h\alpha \sin \beta L$
$B_T = \sin h\alpha \cos \beta L + j \cos h\alpha \sin \beta L$.
Substituting and simplifying yields $$\frac{A+B+C+D}{2} = \frac{(\cosh\alpha + \sinh\alpha)[\cos\beta L - \omega c \sin\beta L] + j[(\cosh\alpha + \sinh\alpha)(\omega c \cos\beta L + \sin\beta L) - \omega c]}{1 - \omega c \cosh\alpha \sin\beta L + j\omega c \sinh\alpha \cos\beta L}$$

Recognizing that $\cosh\alpha + \sinh\alpha = e^{\alpha}$ $\cosh\alpha = \dfrac{e^{\alpha} + e^{-\alpha}}{2}$ and $\sinh\alpha = \dfrac{e^{\alpha} - e^{-\alpha}}{2}$ then $$\frac{A+B+C+D}{2} = \frac{e^{\alpha}(\cos\beta L - \omega c \sin\beta L) + j[e^{\alpha}(\omega c \cos\beta L + \sin\beta L) - \omega c]}{1 - \omega c \sin\beta L \left(\dfrac{e^{\alpha} + e^{-\alpha}}{2}\right) + j\omega c \cos\beta L \left(\dfrac{e^{\alpha} - e^{-\alpha}}{2}\right)}$$

Then the insertion loss is:

$$\text{Loss(dB)} = 10 \log_{10} \left| \frac{e^{\alpha}(\cos\beta L - \omega c \sin\beta L) + j[e^{\alpha}(\omega c \cos\beta L + \sin\beta L) - \omega c]}{1 - \omega c \sin\beta L \left(\dfrac{e^{\alpha} + e^{-\alpha}}{2}\right) + j\omega c \cos\beta L \left(\dfrac{e^{\alpha} - e^{-\alpha}}{2}\right)} \right|^2 \quad (10)$$

With the help of the following identities the modulus can be evaluated more easily.

$|x + jy| = \sqrt{x^2 + y^2}$ $|x + jy|^2 = x^2 + y^2$ $\left|\dfrac{A}{B}\right| = \dfrac{|A|}{|B|}$ and therefore $\left|\dfrac{A}{B}\right|^2 = \dfrac{|A|^2}{|B|^2}$ The final equation for insertion loss becomes:

$$\text{Loss(dB)} = 10 \log_{10} \frac{[e^{\alpha}(\cos\beta L - \omega c \sin\beta L)]^2 + [e^{\alpha}(\omega c \cos\beta L + \sin\beta L) - \omega c]^2}{\left[1 - \omega c \left(\dfrac{e^{\alpha} + e^{-\alpha}}{2}\right) \sin\beta L\right]^2 + \left[\omega c \left(\dfrac{e^{\alpha} - e^{-\alpha}}{2}\right) \cos\beta L\right]^2} \quad (11)$$

where $\alpha = $ attenuation in nepers $= \dfrac{\text{attenuation in dB}}{2.685889638}$
$c = $ normalized capacitance
$L = $ total length of attenuator and transmission line.

As shown in FIG. 7, for a particular level of attenuation (dB) and attenuator capacitance, there is only one electrical length (L) which minimizes frequency sensitivity over the frequency range from DC to 2 gigahertz without the use of other components. If, however, due to mechanical limitations, it is impossible to use this prescribed length, then other components must be used to achieve the desired linear response. For example, if, for a particular capacitance, the length-attenuation intersection is located to the left of the curve, then a shunt inductance of proper value will be required to minimize the frequency sensitivity.

This inductance may be obtained at microwave frequencies for example by lengthening the size of the grounding conductor path, 80 connected to the 32 dB resistive deposits. Gold is used to form the conductors for the resistive sections as well as the other conductors of the device. The location and size of the inductive shunt component, for instance 80 for resistive element 78, is determined in part by the configuration of the particular resistor section under consideration. For the resistive T sections the compensating inductive component extends under and partly up the resistive element and forms the connection between the respective resistive deposits and the conductor 42. The resistive sections of π configuration have the cross bar of a T connecting the resistive legs and the upright extending to the conductor 42.

For some attenuation values the actual electrical length of the attenuator network may fall to the right of the electrical length prescribed by the curves of FIG. 7. In that case, a series inductance or a uniformly distributed capacitance over the shunt area may be used to minimize the frequency sensitivity of the resistive sections.

As previously indicated, it is not possible to fully compensate the lower dB attenuators for variations in attenuation with frequency. A reference to FIG. 7 makes one of the problems readily apparent. If the uncompensated electrical length of a typical attenuator section is 0.10; it can be seen that at the 1–4 dB range, the compensating inductance required is quite large and in practice has not been achieved.

Compensation in effect, has been achieved in accordance with the preferred embodiment of the present invention by increasing the insertion losses as a function of frequency of the minimum loss circuits associated with the lower value attenuator sections. The apparatus of the invention is employed in measurement and testing by first inserting the attenuator in the circuit to be tested with zero attenuator, i.e. with none of the attenuator sections inserted. The insertion loss characteristic of the device is illustrated in FIG. 10 by the Curve A which is a plot of insertion loss as a function of frequency. Curve B illustrates the desired attenuation characteristic of a lower value attenuator section. However, due to the effect of the switch capacitance and shunt capacitance of the resistor components to the ground plane at these lower orders of attenuation, the curve actually achieved is illustrated by curve C.

In accordance with the present invention, a resistive stub is incorporated in the minimum loss path of such attenuator section to increase the frequency sensitivity of this path so that the displacement between the insertion loss curve of this minimum loss path and curve C remains relatively constant with frequency. The desired curve is illustrated as the curve D of FIG. 10 wherein the insertion loss increases with frequency at a greater rate than the uncompensated minimum loss circuit.

The mechanism for achieving such a result is illustrated in FIG. 9 of the accompanying drawing. In this Figure, the 1 dB, 2 dB, 4 dB and 8 dB sections are modified. Specifically, resistance stubs 153, 155, 157 and 159 are added to the 1 dB, 2 dB, 4 dB and 8 dB attenuator minimum loss circuits, respectively. The stubs extend generally vertically from minimum loss conductors 161, 163, 164 and 166 of the aforesaid attenuator sections, each such resistive stub being proportioned to modify the insertion loss vs frequency characteristic of each attenuator minimum loss path to compensate for the difference in frequency sensitivity of this path and its associated attenuator section.

Thus, the desired response of the system with frequency is achieved over the entire frequency range even at the lower attenuator levels. It is apparent that the resistive stubs of FIG. 9 may also be employed with the configuration of FIG. 6.

The effects of the resistive stub on the frequency sensitivity of the minimum loss circuits may be determined by the following analysis:

RESISTIVE STUB ANALYSIS

Assuming that the resistive stub is a distributed network, then the loss, due to the stub, in a straight through transmission line can be calculated by knowing the admittance (Y) of the stub.

$$Y_{in} = \frac{I_{in}}{V_{in}} = \frac{1}{Z_s} \cdot \frac{\sinh \gamma l}{\cosh \gamma l} = \frac{\tanh \gamma l}{Z_s}$$

let $Z_s$ = characteristic impedance of stub and the general equation for the propagation constant is:

$$\gamma = \sqrt{(R + j\omega L)(G + j\omega c)} \quad (1)$$

where
 R = resistance per unit length
 L = inductance per unit length
 G = conductance per unit length
 C = Capacitance per unit length For this particular application, that is evaluating the response due to the resistive stub, two approximations can be made. First, since the dielectric can be considered ideal, then G=0. Second, the values of R (resistances) being considered are much greater than $\omega L$ for the frequencies range investigated. So, formula 1 reduces to:

$$\gamma = \sqrt{j\omega RC} \quad (2)$$

and performing the square roots yields:

$$\gamma = \sqrt{\frac{\omega RC}{2}} + j\sqrt{\frac{\omega RC}{2}} \quad (3)$$

Again, the general equation for $Z_o$ of a distributed line is $$Z_o = \sqrt{\frac{R + j\omega L}{G + j\omega C}} \quad (4)$$

and again since $R >> \omega L$ and $G=0$.
Equation 4 reduces to:

$$Z_o = \sqrt{-j\frac{R}{\omega C}} \quad (5)$$

and performing the square root yields:

$$Z_o = \sqrt{\frac{R}{2\omega C}} + j\sqrt{\frac{R}{2\omega C}} \quad (6)$$

The ABCD-matrix of this stub in a zero loss transmission line, see the equivalent circuit of FIG. 11, is $$\begin{pmatrix} 1 & 0 \\ Y_{in} & 1 \end{pmatrix}$$

where $$y_{in} = \frac{\tanh \gamma l}{Z_s}.$$

The insertion loss equation is generated from the following:

$$\text{insertion loss} = 10 \log_{10} \left| \frac{Z_g + Z_l + O + Z_g Z_l Y_{in}}{Z_g + Z_l} \right|^2$$

where $Z_g$ is the impedance of the generator and $Z_l$ is the impedance of the load.

Allowing $Z_l = Z_g = Z_o$ then $$\text{insertion loss} = 10 \log \left| 1 + \frac{Z_o}{2} Y_{in} \right|^2$$

and substituting for $Y_{in}$ $$\text{insertion loss} = 10 \log_{10} \left| 1 + \frac{Z_o}{2 Z_s} \tanh \gamma l \right|^2$$

$$\text{where } Z_s = \sqrt{\frac{R}{2\omega C}} + j\sqrt{\frac{R}{2\omega C}}$$

$$\gamma = \sqrt{\frac{\omega RC}{2}} + j\sqrt{\frac{\omega RC}{2}}$$

To provide the proper inductive or capacitive value to an attenuator, the compensating element, for instance, is made slightly physically larger than anticipated requirements. The device is then inserted in an R.F. system and if the value is not high enough some of the gold is trimmed away until the desired value is achieved. If, series inductance is needed, then some of the resistive material may be removed as previously indicated.

While I have described and illustrated several specific embodiments of my invention, it will be clear that variations of the details of construction which are specifically illustrated and described may be resorted to without departing from the true spirit and scope of the invention as defined in the appended claims.

What I claim is:

1. A microwave attenuator, comprising:
   a transmission line;
   attenuator means selectively connectable to said transmission line to provide attenuation;
   switch means for selectively connecting said attenuator means to said transmission line;
   said switch means having inherent interelectrode capacitance causing the impedance of said attenuator means to vary measurably as a function of frequency of signals on said transmission line at, at least, the upper frequencies of a frequency range to 2 gigahertz;
   said attenuator means and transmission line being characterized by an optimal electrical length for a desired level of attenuation and switch capacitance, and
   means, having reactive impedance included in said attenuator means, providing compensation for deviation from said optimal electrical length resulting from said switch capacitance to maintain a constant level of attenuation over a desired frequency range.

2. The microwave attenuator of claim 1, wherein:
   said optimal electrical length (L) is defined by $$\text{Loss(dB)} = 10 \log_{10} \frac{[e^{\alpha}(\cos\beta L - \omega c \sin\beta L)]^2 + [e^{\alpha}(\omega c \cos\beta L + \sin\beta L) - \omega c]^2}{\left[1 - \omega c \left(\frac{e^{\alpha} + e^{-\alpha}}{2}\right)\sin\beta L\right]^2 + \left[\omega c \left(\frac{e^{\alpha} - e^{-\alpha}}{2}\right)\cos\beta L\right]^2}$$

where
$\alpha$ = attenuation in nepers (dB/8.685889638),
c = normalized switch means capacitance, L = total electrical length of said attenuator means and transmission line,
$\beta$ = phase shift per unit of length of transmission line,
$\omega = 2\pi f$ and
loss (dB) is the insertion loss expressed in decibels.

3. The microwave attenuator of claim 1, wherein: said compensation means is adapted to provide inductive or capacitive characteristics to compensate for the deviation from said optimal electrical length.

4. A microwave attenuator circuit, comprising: an insulative substrate having a ground conductor and a transmission line provided on said substrate;
   switch means including switchable contact elements selectively connectable to said transmission line to establish a minimum loss path and a higher loss path thereacross;
   attenuator means coupled to said ground conductor and to the contact elements corresponding to said higher loss path, said attenuator means and transmission line being characterized by a combined, optimal electrical length for a desired level of attenuation and associated interelectrode capacitance of said switch which minimizes frequency sensitivity; and
   means, having reactive impedances included in said attenuator means, providing compensation for deviation from said optimal electrical length to maintain a substantially constant level of attenuation over a desired frequency range.

5. The microwave attenuator circuit of claim 4, wherein:
   said compensation means is adapted to provide inductive or capacitive characteristics to compensate for the deviation from said optimal electrical length.

6. The microwave attenuator circuit of claim 4, or claim 1 wherein said compensation means comprises:
   a conductive pad formed on said substrate for coupling said attenuator means to said ground conductor and shaped to provide a compensating inductance.

7. The microwave attenuator circuit of claim 6, wherein:
   said conductive pad is T-shaped in configuration.

8. The microwave attenuator circuit of claim 4, wherein said attenuator means comprises:
   a resistive pad formed on said substrate with a portion of said resistive pad removed to provide a compensating inductance.

9. The microwave attenuator circuit of claim 4, wherein:
   said attenuator means comprises a resistive pad formed on said substrate; and
   said compensation means comprises an insulating glaze overlying said resistive pad and a conductor formed on top of said glaze and coupled to said ground conductor to provide a compensating capacitance.

10. The microwave attenuator circuit of claim 4, wherein:
    said optimal electrical length (L) is defined by $$\text{Loss(dB)} = 10 \log_{10} \frac{[e^{\alpha}(\cos\beta L - \omega c \sin\beta L)]^2 + [e^{\alpha}(\omega c \cos\beta L + \sin\beta L) - \omega c]^2}{\left[1 - \omega c \left(\frac{e^{\alpha} + e^{-\alpha}}{2}\right)\sin\beta L\right]^2 + \left[\omega c \left(\frac{e^{\alpha} - e^{-\alpha}}{2}\right)\cos\beta L\right]^2}$$

where
$\alpha$ = attenuation in nepers (dB/8.685889638),
c = normalized switch means capacitance, L-total electrical length of said attenuator means and transmission line,
$\beta$ = phase shift per unit of length of transmission line,
$\omega = 2\pi f$ and
loss (dB) is the insertion loss expressed in decibels.

11. The microwave attenuator circuit of claim 4, wherein:
said transmission line and ground conductor are located on opposite surfaces of said substrate; and
said substrate includes a window opening through which said attenuator means is coupled to said ground conductor.

12. The microwave attenuator circuit of claim 11, which includes:
a conductive pad formed on said substrate which extends through said window opening to electrically connect said attenuator means to said ground conductor.

13. The microwave attenuator circuit of claim 11 including:
a conductive pad formed on said substrate,
said conductive pad being T-shaped in configuration to provide a compensating inductance.

14. The microwave attenuator circuit of claim 11, wherein said attenuator means comprises:
a resistive pad formed on said substrate with a portion of said resistive pad removed to provide a compensating inductance.

15. The microwave attenuator circuit of claim 11, wherein:
said attenuator means comprises a resistive pad formed on said substrate; and
said compensation means comprises an insulating glaze overlying said resistive pad and a conductor formed on top of said glaze and coupled to said ground conductor to provide a compensating capacitance.

16. A switchable microwave step attenuator circuit comprising:
an insulative substrate having a ground plane conductor on one surface of said substrate;
a transmission line provided on the surface of said substrate opposite to said ground plane surface;
a plurality of switch devices mounted on said substrate, each provided with switchable contact elements selectively connectable to said transmission line to establish a minimum loss path and a higher loss path thereacross;
a plurality of attenuator elements provided on said substrate, each coupled between said ground plane and the switchable contact elements corresponding to the higher loss path of each of the said switch devices, each attenuator element together with said transmission line between the switchable contact elements being characterized by a combined, optimal electrical length for a desired level of attenuation and associated switch interelectrode capacitance which minimizes frequency sensitivity; and
compensating means, including reactive impedances, associated with each attenuator element providing compensation for deviation from said optimal electrical length primarily as a result of said switch capacitance whereby to maintain a substantially constant level of attenuation over a desired frequency range.

17. The microwave attenuator circuit of claim 16, wherein:
said compensation means is adapted to provide inductive or capacitive characteristics to compensate for the deviation from said optimal electrical length.

18. The microwave attenuator circuit of claim 16, wherein:
said substrate includes a plurality of window openings formed therein adjacent to said switch devices; and
each of said attenuator elements is coupled to said ground plane conductor through one of said window openings.

19. The microwave attenuator circuit of claim 16, wherein said compensation means comprises:
a conductive pad formed on said substrate for coupling the corresponding attenuator element to said ground plane conductor and shaped to provide a compensating inductance.

20. The microwave attenuator circuit of claim 19, wherein:
said conductive pad is T-shaped in configuration.

21. The microwave attenuator circuit of claim 16, wherein one or more of said attenuator elements comprises:
a resistive pad formed on said substrate with a portion of said resistive pad removed to provide a compensating inductance.

22. The microwave attenuator circuit of claim 16, wherein:
at least one of said attenuator elements comprises a resistive pad formed on said substrate; and
said compensation means comprises an insulating glaze overlying said resistive pad and a conductor formed on top of said glaze and coupled to said ground conductor to provide a compensating capacitance.

23. The microwave attenuator circuit of claim 16, wherein:
said optimal electrical length (L) is defined by $$\text{Loss(dB)} = 10 \log_{10} \frac{[e^{\alpha}(\cos\beta L - \omega c \sin\beta L)]^2 + [e^{\alpha}(\omega c \cos\beta L + \sin\beta L) - \omega c]^2}{\left[1 - \omega c \left(\frac{e^{\alpha} + e^{-\alpha}}{2}\right) \sin\beta L\right]^2 + \left[\omega c \left(\frac{e^{\alpha} - e^{-\alpha}}{2}\right) \cos\beta L\right]^2}$$

where
$\alpha$ = attenuation in nepers (dB/8.685889638),
c = normalized switch means capacitance,
L = total electrical length of said impedance element and transmission line,
$\beta$ = phase shift per unit of length of transmission line,
$\omega = 2\pi f$, and
loss (dB) is the insertion loss expressed in decibels.

24. The microwave attenuator of claim 4 or claim 10 or claim 16 or claim 23 further comprising
a resistive stub connected to said minimum loss path,
said stub providing a frequency response to said minimum loss path which approximates the difference in frequency sensitivity between this path without the stub and its associated higher loss path.

25. The microwave attenuator circuit of claim 16 wherein said transmission line comprises
conductive strips extending along and adjacent to opposed edges of said wafer and into electrical contact with said ground plane, said minimum loss and low loss paths lying between said conductive strips.

26. The microwave attenuator circuit of claim 25 wherein said attenuator elements comprise a conductive layer on said substrate, and
a resistive layer overlying at least a part of said conductive layer, said conductive layer extending into electrical contact with said ground plane.

27. The microwave attenuator circuit of claim 26 wherein said minimum loss path comprises a conductive layer on said substrate concave relative to said resistive layer to reduce coupling between said paths.

* * * * *